(12) United States Patent
Perçin et al.

(10) Patent No.: US 7,224,437 B2
(45) Date of Patent: May 29, 2007

(54) METHOD FOR MEASURING AND VERIFYING STEPPER ILLUMINATION

(75) Inventors: Gökhan Perçin, Los Gatos, CA (US); Abdurrahman Sezginer, Los Gatos, CA (US); Franz Xaver Zach, Los Gatos, CA (US)

(73) Assignee: Invarium, Inc, San Jose, CA (US)

( * ) Notice: Subject to any disclaimer, the term of this patent is extended or adjusted under 35 U.S.C. 154(b) by 43 days.

(21) Appl. No.: 11/141,803

(22) Filed: May 31, 2005

(65) Prior Publication Data

US 2006/0268254 A1 Nov. 30, 2006

(51) Int. Cl.
*G03B 27/42* (2006.01)
*G03B 27/52* (2006.01)

(52) U.S. Cl. .................. 355/55; 355/53
(58) Field of Classification Search ............ 355/52, 355/53, 55; 250/548, 492.2
See application file for complete search history.

(56) References Cited

U.S. PATENT DOCUMENTS

| | | | |
|---|---|---|---|
| 6,078,738 A | 6/2000 | Garza et al. | |
| 6,081,659 A | 6/2000 | Garza et al. | |
| 6,356,345 B1 | 3/2002 | McArthur et al. | |
| 6,544,699 B1 | 4/2003 | Kim et al. | |
| 6,602,728 B1 | 8/2003 | Liebmann et al. | |
| 6,634,018 B2 | 10/2003 | Randall et al. | |
| 6,704,695 B1 | 3/2004 | Bula et al. | |
| 6,741,338 B2 | 5/2004 | McArthur et al. | |
| 6,749,972 B2 | 6/2004 | Yu | |
| 6,768,958 B2 | 7/2004 | Ivanovic et al. | |
| 6,868,355 B2 | 3/2005 | Ivanovic et al. | |
| 6,870,603 B2 | 3/2005 | Teeuwen | |
| 6,876,092 B2 | 4/2005 | Ballarin | |
| 6,879,380 B2 | 4/2005 | Imai | |
| 6,904,169 B2* | 6/2005 | Kalevo et al. | 382/167 |
| 2003/0082463 A1* | 5/2003 | Laidig et al. | 430/5 |
| 2004/0119957 A1* | 6/2004 | Renwick et al. | 355/53 |
| 2006/0072097 A1* | 4/2006 | Zach et al. | 355/69 |

OTHER PUBLICATIONS

U.S. Appl. No. 10/960,357, filed Oct. 6, 2004, Zach et al.
J. P. Kirk, et al., "Pupil illumination: in situ measurement of partial coherence," (Proc. SPIE vol. 3334, 1998, pp. 281-288).
Butler, et al., "Estimating solutions of first kind integral equations with nonnegative constraints and optimal smoothing," (SIAM J. Numer. Anal., vol. 18, No. 3, Jun. 1981).

* cited by examiner

*Primary Examiner*—Henry Hung Nguyen
*Assistant Examiner*—Chia-how Michael Liu
(74) *Attorney, Agent, or Firm*—Jerry R. Potts

(57) ABSTRACT

An apparatus and method for characterizing an illumination pupil of an exposure tool comprises forming a plurality of pinhole test patterns at a plurality of test site locations to facilitate locating test pattern edges for extracting therefrom the illumination pupil characteristics of the exposure tool.

28 Claims, 9 Drawing Sheets

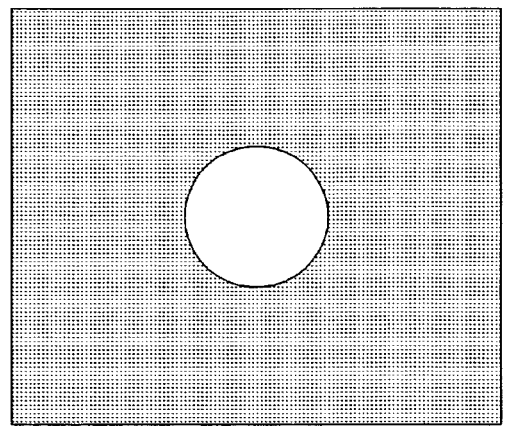
FIG. 2
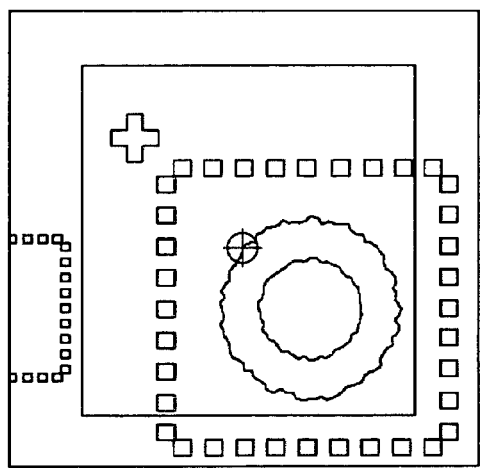 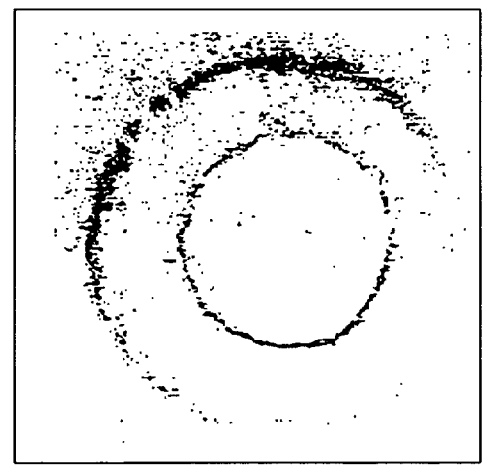
FIG. 3A FIG. 3B

METHOD FOR MEASURING AND
VERIFYING STEPPER ILLUMINATION

RELATED APPLICATIONS

This application is related to U.S. patent application Ser. No. 11/141,805 Entitled, "METHOD FOR VERIFYING AND CHOOSING LITHOGRAPHY MODEL", filed May 31, 2005, which related application is incorporated herein by reference as though fully set forth and which is filed concurrently on the same date with the present application.

TECHNICAL FIELD

This invention relates to the general field of lithography. In particular, it relates to the measuring and verifying beam intensity profile (illumination pupil) for exposure equipment used in lithography.

BACKGROUND OF INVENTION

Computational models utilized in optimal proximity correction (OPC) processes include parameters which are either determined empirically or are otherwise provided by optical equipment manufacturers for the optical equipment utilized in lithography processes. For example, optical equipment manufacturers typically provide for the benefit of nano circuit designers optical equipment parameters such as lens aberrations, flare, numerical aperture and illumination pupil or beam intensity profile. In short then, the parameters provided by the optical equipment manufacturer are not measured nor verified prior to a computational model for OPC being calibrated.

Unless any given computational model parameter is measured and verified, certain inaccuracies may result in the computational model. Therefore it would be highly desirable to have a new and improved method of measuring and verifying illumination pupil for lithography exposure equipment.

BRIEF SUMMARY OF THE INVENTION

An apparatus and method for characterizing an illumination pupil of an exposure tool comprises forming a plurality of pinhole test patterns at a plurality of test site locations to facilitate locating test pattern edges for extracting therefrom the illumination pupil characteristics of the exposure tool.

BRIEF DESCRIPTION OF THE DRAWINGS

The above mentioned features and steps of the invention and the manner of attaining them will become apparent, and the invention itself will be best understood by reference to the following description of the preferred embodiment(s) of the invention in conjunction with the accompanying drawings wherein:

FIG. 2 is a diagrammatic illustration of a pinhole mask pattern that has been exposed at different dose and defocus settings;

DETAILED DESCRIPTION OF THE PREFERRED EMBODIMENTS

Systems and methods for measuring and verifying a beam intensity profile (illumination pupil) for a lithography exposure tool utilized in a lithography process are disclosed. The following description is presented to enable any person skilled in the art to make and use the invention. For purposes of explanation, specific nomenclature is set forth to provide a thorough understanding of the present invention. Descriptions of specific applications, methods, and apparatus are provided only as examples. Various modifications to the preferred embodiments will be readily apparent to those skilled in the art, and the general principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
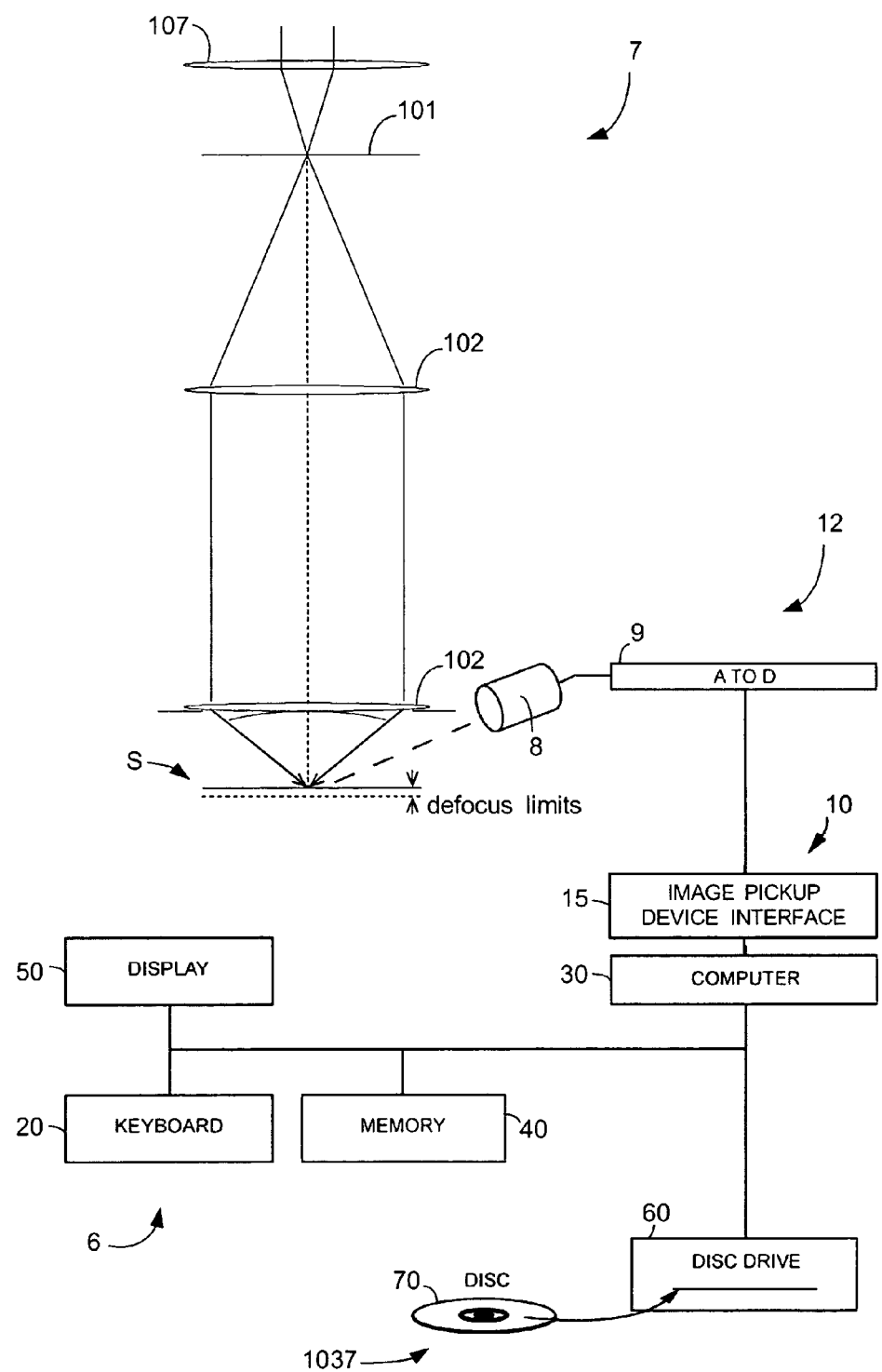
FIG. 1 is a diagrammatic block diagram of a profiling system, which is constructed in accordance with a preferred embodiment of the present invention.

Referring now to the drawings and more particularly to FIG. 1 thereof, there is illustrated a profiling system 6, which is constructed according to a preferred embodiment of the present invention. In this embodiment, the profiling system 6, through a computer readable program product 70, implements a verification or profiling method 1037, which facilitates characterizing an illumination pupil of an exposure tool 7. More particularly, the verification method 1037, as will be explained hereinafter in greater detail, processes a plurality of pinhole test patterns formed at a plurality of test site locations to facilitate edge locations and then, upon edge location, extracts the illumination pupil characteristic of the exposure tool that caused the pinhole test patterns to be formed.

Before discussing the preferred embodiment of the present invention in greater detail, it may be beneficial to briefly review the design of integrated circuits with reference to sub lightwave length optical lithography as applied to an article of manufacture having sub-lightwave length nano structures, and more particularly what is known as model-based optical proximity correction (OPC).

Model-based optical proximity correction (OPC) adjusts photomask data so that the pattern resulting on the wafer is a close replica of a target pattern. An essential element of model-based OPC is a computational model of the pattern ing process. The computational model describes all or some aspects of: optical projection, reactions and diffusion of chemicals in the photoresist, and etching of the wafer. The computational model usually has parameters that need to be determined empirically. These parameters are determined by printing individual test patterns on wafers using the lithography equipment and process that need to be modeled. Critical dimensions of the patterns resulting on the test wafer are measured. Some parameters of the model are adjusted until the difference between the predictions of the model and the patterns printed on the wafer are minimized. This process is called "calibration" of the model. In addition, the computational model has some parameters that are provided by the exposure tool supplier, such as illumination pupil (beam intensity profile), lens aberrations, flare, numerical aperture, etc. Currently, these parameters are not measured nor verified prior to the computational model for OPC being calibrated.

The prior art described in the following US patents use invasive metrology to determine illumination pupil (or equivalently beam intensity profile for the exposure tool). Either the required metrology modification is built in the tool or the tool is modified temporarily to accommodate this invasive metrology.

Imai, "Method for evaluating lithography system, method for adjusting substrate-processing apparatus, lithography system, and exposure apparatus," U.S. Pat. No. 6,879,380, Apr. 12, 2005.

Ballarin, "Substrate provided with an alignment mark, method of designing a mask, computer program, mask for exposing said mark, device manufacturing method, and device manufactured thereby," U.S. Pat. No. 6,876,092, Apr. 5, 2005.

McArthur, et al., "In-situ source metrology instrument and method of use," U.S. Pat. No. 6,741,338, May 25, 2004.

McArthur, et al., "In-situ source metrology instrument and method of use" U.S. Pat. No. 6,356,345, Mar. 12, 2002.

Teeuwen, "Lithographic apparatus and method to determine beam characteristics," U.S. Pat. No. 6,870,603, Mar. 22, 2005.

In addition, J. P. Kirk, et al., "Pupil illumination: in situ measurement of partial coherence," Proc. SPIE vol. 3334, 1998, p. 281–288 describes a technique for recording the illumination distribution. In this method, a pinhole is placed on the backside of the photomask.

Zach, et al., "Method for characterization of the illuminator in a lithographic system," U.S. patent application Ser. No. 10/960,357, filed Oct. 6, 2004 describes an alternative embodiment where double exposure is used and inversion algorithm is substantially different. More particularly, the '357 application utilizes double-exposure for each formed test image and best focus. The preferred embodiment of the present invention as will be described hereinafter, utilizes on a single exposure and multiple dose and defocus settings, a focus exposure matrix (FEM), and an image processing method to detect the edges of printed photoresist patterns along with sampled resist contour points to provide an inverted pupil illumination. In short, the '357 patent application does not suggest, nor disclose FEM image processing or inversion.

The prior art of calibrating OPC models described in the following US patents do not take verification of illumination pupil, lens aberrations and flare into account. The models are calibrated using the illumination pupil and lens aberrations characteristics provided by the exposure tool supplier.

Ivanovic, et al., "Automatic Calibration of A Masking Process Simulator," U.S. Pat. No. 6,768,958, issued Jul. 27, 2004.

Ivanovic, et al., "Automatic Calibration of A Masking Process Simulator," US Patent Application Publication No. 20040199349, Oct. 7, 2004.

Garza, et al., "Comparing Aerial Image to SEM of Photoresist or Substrate Pattern for Masking Process Characterization," U.S. Pat. No. 6,078,738, Jun. 20, 2000.

Laidig, et al., "Method of Two Dimensional Feature Model Calibration and Optimization." US Patent Application Publication No. 20030082463, May 1, 2003.

Garza, et al., "Comparing Aerial Image to Actual Photoresist Pattern for Masking Process Characterization," U.S. Pat. No. 6,081,659, issued Jun. 27, 2000.

Bula, et al., "Interactive Optical Proximity Correction Design Method," U.S. Pat. No. 6,704,695, issued Mar. 9, 2004.

Yu, "Optical Proximity Correction Common Process Window Maximization Over Varying Feature Pitch," U.S. Pat. No. 6,749,972, issued Jun. 15, 2004.

Randall, et al., "Optical Proximity Correction," U.S. Pat. No. 6,634,018, issued Oct. 14, 2003.

Liebmann, et al., "Method for Generating A Proximity Model Based On Proximity Rules," U.S. Pat. No. 6,602,728, issue Aug. 5, 2003.

Kim, et al., "Method To Improve Accuracy of Model-Based Optical Proximity Correction," U.S. Pat. No. 6,544,699, issue Apr. 8, 2003.

The prior art of calibrating OPC models fail to take into account verification of illumination pupil. Instead, such prior art models are calibrated using the illumination pupil characteristics provided by the exposure tool supplier. Furthermore, the prior art describing metrology for illumination pupil generally utilize either invasive methods or hardware built-in to the exposure tool, which require very expensive tool modifications. The above-mentioned deficiencies and expensive solutions are overcome in the preferred embodiment of the present invention. In this regard, the preferred embodiment of the present invention, provides a novel system and method for experimentally verifying and measuring illumination pupil characteristics of an exposure tool used in lithography, and then applying the measured illumination pupil in the model calibration for OPC.

Considering now the profiling system 6 in still greater detail, the profiling system 6 generally includes a projection optical system 7 and a computer aided design (CAD) system 10, which are coupled together by an image capture system 12. The image capture system 12 generally includes a image pickup device or scanning electronic microscope 8, an analog to digital converter 9 and a image pickup device interface unit 15, which allows sub lightwave test structure objects to be scanned and transferred in a digital format to the CAD system 10 for processing.

Considering now the optical system or imaging system 7 in greater detail with reference to FIG. 1, the projection optical system 7 as illustrated is utilized for projection lithography. In this regard, the system 7, when in use, utilizes a projection lens 107, a test mask (reticle) 101, and a pair of lenses 102 to cause an image to be formed on a substrate S.

In order to detect the sub lightwave structures formed on the substrate S, the system 6 further includes a image pickup device 8, such as a scanning electronic microscope (SEM), an analog to digital converter 9 and a image pickup device interface unit 15, all of which form part of the image capture system 12. As the operation and construction of such electronic items are well known to those skilled in the art, details of their operation and structure will not be provided.

Considering now the CAD system 10 in greater detail, the CAD system 10 generally includes a computer 30 which is coupled to a set of input/output devices such as a keyboard 20, a random access memory 40, a display 50 and a disc drive 60. The disc drive 60 is capable of reading a computer usable medium or program product, such as a DVD disc 70, as well as recording, on a DVD disc, any information that would assist a user of the system. As will be described hereinafter in greater detail, the disc 70 has encoded thereon computer readable code, which causes the computer 30 to execute or implement the novel verification method 1037.

Figure 8:
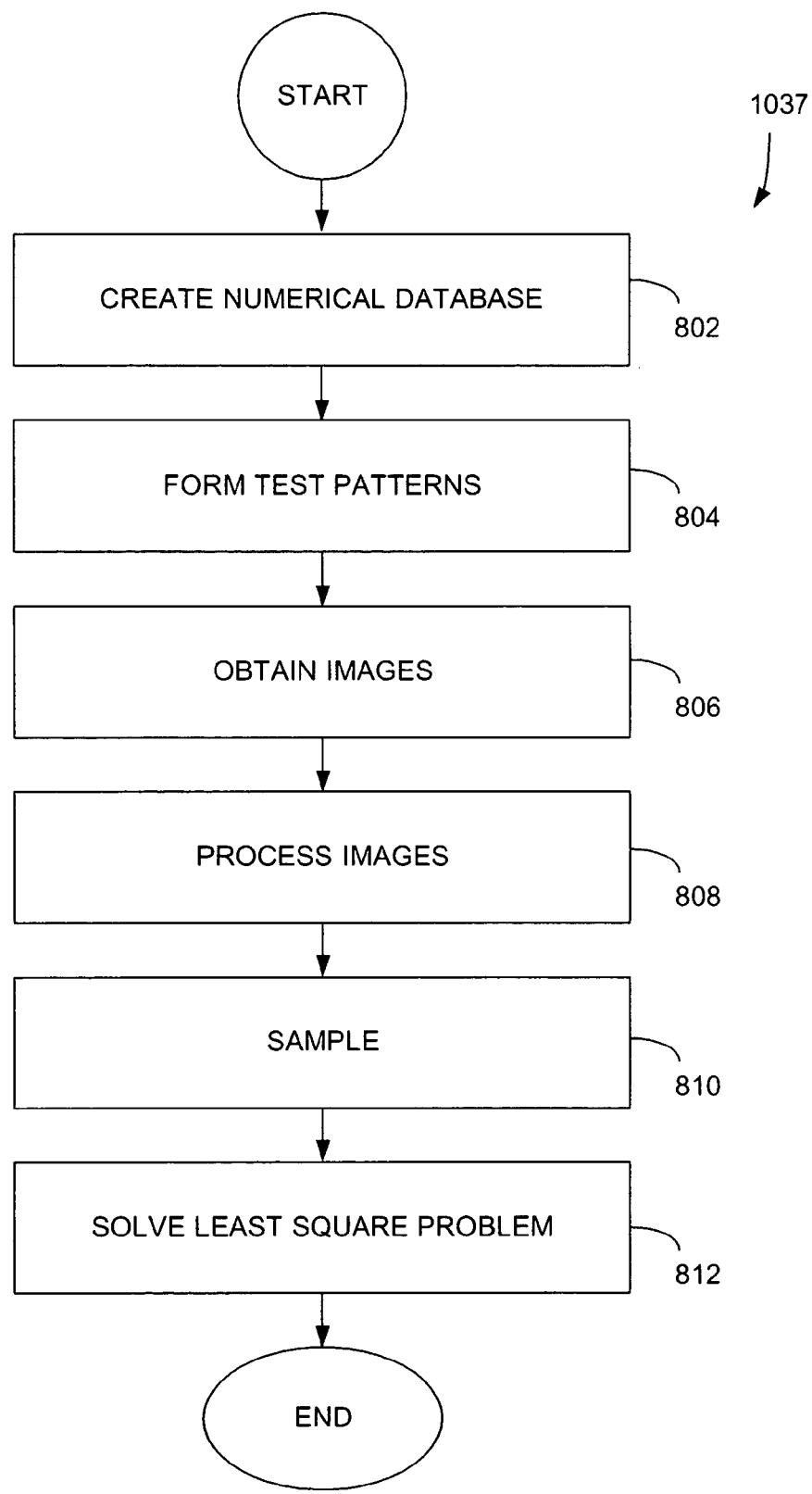
FIG. 8 is a simplified flow chart of the method of characterizing an illumination pupil of an exposure tool, which method is in accordance with a preferred embodiment of the present invention.

Considering now the profiling method 1037 in greater detail with reference to FIG. 8, the profiling method 1037 for verifying and measuring illumination pupil characteristics for the exposure tool generally comprises the following steps:

In a forming or establishing a database step 802, the method 1037 proceeds to create a numerical database which consists of an aerial image of a pinhole having about a 3 μm diameter through several defocus values extending over a range of between about 0.1 microns to about 20 microns using a point source located at each grid of illumination pupil plane and the default numerical aperture of the exposure tool.

Next, in a forming pattern step 804, the method 1037 causes the projection system 7 to print a series of test patterns (i.e. pinholes), such as shown in FIG. 2, at multiple sites on a substrate S and with different predetermined dose and defocus conditions;

With the substrate S now printed, the method 1037 continues to an obtaining step 806, which causes the SEM device 8 to capture the images of the printed patterns on the substrate S. The images are disposed at multiple sites where different dose and defocus conditions were employed. Although in the preferred embodiment a scanning electronic microscope has been described for capturing the printed images, it will be understood by those skilled in the art that other capture devices could also be utilized. For example, the images can also be captured by atomic-force microscopy (AFM), scanning-tunneling microscopy (STM), or transmission electron microscopy (TEM).

The images captured by the image pickup device 8 are converted to digital images by the analog to digital converter 9 and then transferred to the CAD system 10 via the image pickup device interface unit 15. When the images are received by the CAD system 10, the profiling method 1037 advances to a processing step 808, which causes the CAD system 10 to process the captured SEM images with edge-detection algorithm. As will be explained hereinafter in greater detail, the edge-detection algorithm goes through a series of image processing steps which enables each image to be used for extracting a profile as will be explained hereinafter in greater detail. FIGS. 3A–H illustrate the various image processing steps.

Next at a sampling step 810, from the database created at step 802, the process takes the calculated aerial images developed at step 802 and samples the points where edge contours are located. The sampled edge contour points are then aligned with respect to each other. It should be noted that the weighted summation of aerial image values at such points (corresponding to a single dose and defocus setting) taken with respect to all grid points of illumination pupil plane will be equal to the dose-to-clear divided by the dose value corresponding to the edge contour. The weighting factors for each grid point at the illumination pupil plane are the unknowns.

Finally, at a solving step 812, the method 1037 causes the CAD system 10 to solve a least square problem which is defined as a result of the sampling step 810, as will be explained hereinafter in greater detail.

Considering now the processing step 808 in still greater detail, after printing the pinhole test patterns, SEM images of the printed structures are taken. Such printed test structure images, however, are generally noisy and they have spurious marks (such as SEM alignment and focus marks) as seen in FIG. 3A. During the processing step 808 these spurious marks are removed, resulting in an image as best seen in FIG. 3B.

Figure 3C:
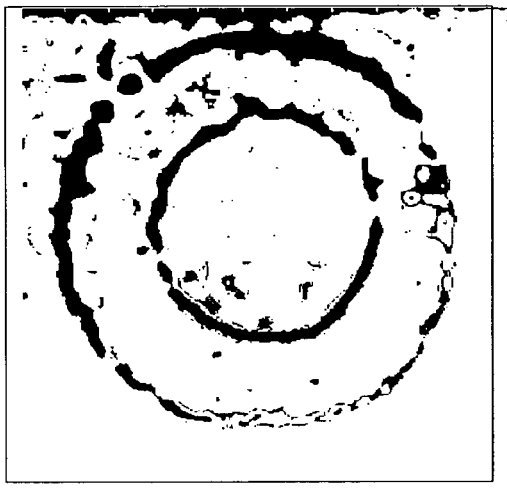
FIG. 3 is a series of edge-detection steps associated with a scanned electronic microscope image of a test photoresist pattern.

The processing step continues by applying a de-noising algorithm to the cleaned up images in order to highlight the location of the edges as shown in FIG. 3C. Typically, de-noising can be accomplished by using methods like minimum total variance algorithm, Perona-Malik diffusion (non-linear scalar diffusion), Gaussian derivatives, non-local means, and any combination of these methods.

For example, the following is an illustration of using the non-linear diffusion scheme as a de-noising method:

$$\partial_s L = \nabla \cdot (c(\|\nabla L\|)\nabla L)$$

where c is a scalar function dependent on the gradient norm $\|\nabla L\|$.

Perona and Malik were the first to introduce non-linear diffusion within the image-processing context. In this regard, they introduced a conductivity function defined as follows:

$$c(\|\nabla L\|) = \exp\left(\frac{\|\nabla L\|^2}{k^2}\right)$$

With this short hand notation it is now possible to write a 2nd order Taylor expansion of the image L as follows:

$$L(x+y, s) = L + x^T \nabla L + \frac{1}{2}x^T H_L x$$

where ΔL is the gradient of the image function:

$$\nabla L = \begin{pmatrix} L_x \\ L_y \end{pmatrix}$$

and $H_L$ is the Hessian matrix:

$$H_L = \begin{pmatrix} L_{xx} L_{xy} \\ L_{xy} L_{yy} \end{pmatrix}$$

Figure 3D:
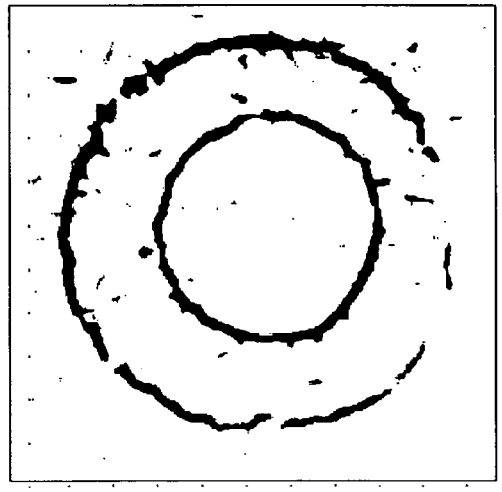
Figure 3E:
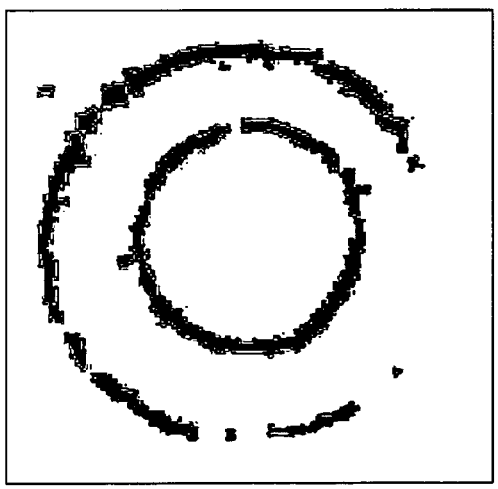
Figure 3F:
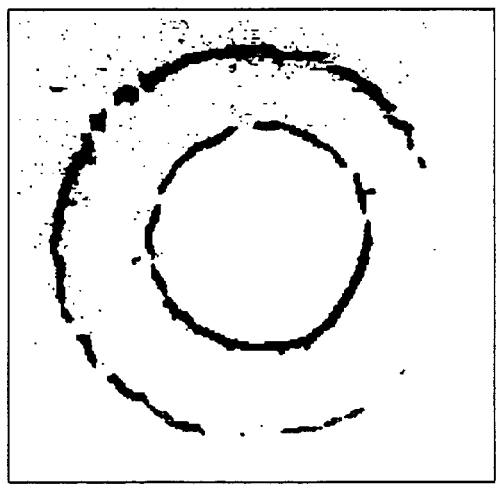
Figure 3G:
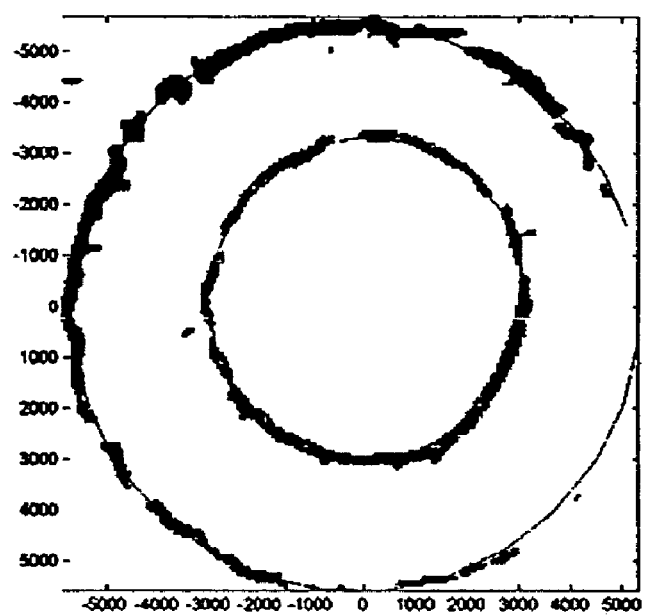
Figure 3H:
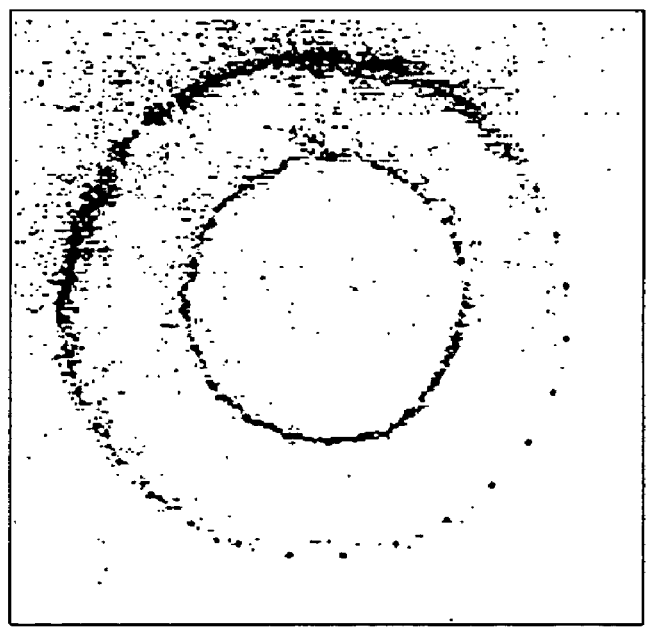

After edges are detected, the next step is fitting a smooth contour to the detected edge points. This can be done using curve fitting algorithms such as fitting circles (for annular and circular illuminations) and fitting Fourier curves (for Quasar illumination) as shown in FIG. 3H.

After uniformly sampled edge contour points are obtained and they are aligned with respect to each other, the inversion problem is set up. The weighted summation of aerial image values at these points (corresponding to a single dose and defocus setting) over all the grid points at illumination pupil plane will be equal to the dose to clear divided by the corresponding dose. The weighting factors for each grid point at illumination pupil plane are the unknowns. This step is summarized with the following equation:

$$\frac{D_0}{D_{ij}} \stackrel{LSQ}{=} \sum_{x,y} \Delta k_x \Delta k_y I(k_x, k_y) |U(x_{ijk}, y_{ijk}, z_{ij}; k_x, k_y)|^2$$

$$I(k_x, k_y) \geq 0$$

where $D_0$ is the dose to clear, $D_{ij}$ is the dose value for corresponding $x_{ijk}$ and $y_{ijk}$ sampled edge contour points, $z_{ij}$ is the defocus value for corresponding $x_{ijk}$ and $y_{ijk}$ sampled edge contour points, $k_x$ and $k_y$ are the illumination pupil plane coordinates, and I is the value of the illumination pupil intensity at the points $k_x$ and $k_y$. The inversion problem above is finding the values $I(k_x,k_y)$ in least square sense. There are several methods in the literature to solve linear least square problems with non-negativity constraints. We use the method described in Butler, et al., "Estimating solutions of first kind integral equations with nonnegative constraints and optimal smoothing," SIAM J. Numerical Analysis, vol. 18, no. 3, June 1981.

Figure 4:
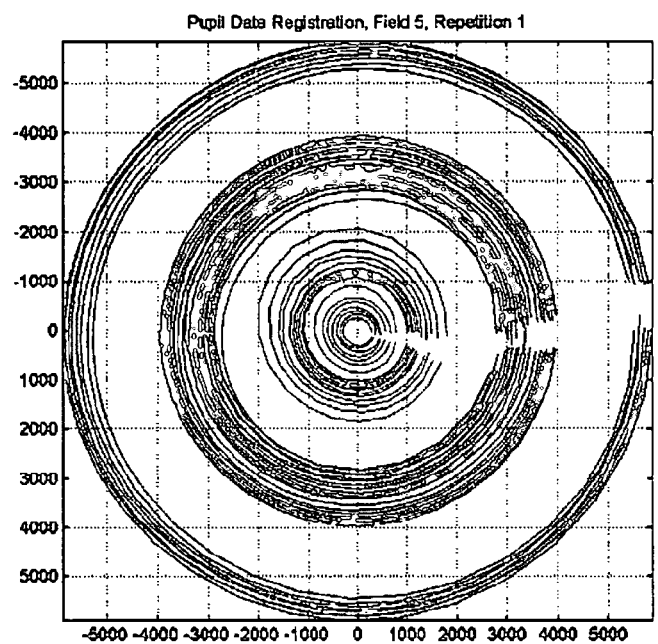
FIG. 4 is a graph of edge contours for a specific field location and repetition, where detected edge contours for all dose and defocus settings are plotted.

It should be noted that taking multiple images, such as SEM of the same pattern, may increase the quality of the de-noised images; however, taking the SEM image of photoresist pattern multiple times may heat the photoresist and cause the pattern dimensions change. But, taking multiple SEM images of the same etched pattern will not have this problem. Multiple images can be averaged to decrease the noise and highlight the edge location. FIG. 4 for example, illustrates edge contours for a specific field location and repletion, where detected edge contours for all dose and defocus settings are plotted on the illustrated graph.

Edge detection can be accomplished by thresholding the gradient of the de-noised image. Moreover, it can be also be accomplished by thresholding the maximum of the eigenvalues of the Hessian matrix of the de-noised image as shown in FIGS. 3D–E respectively.

Figure 5:
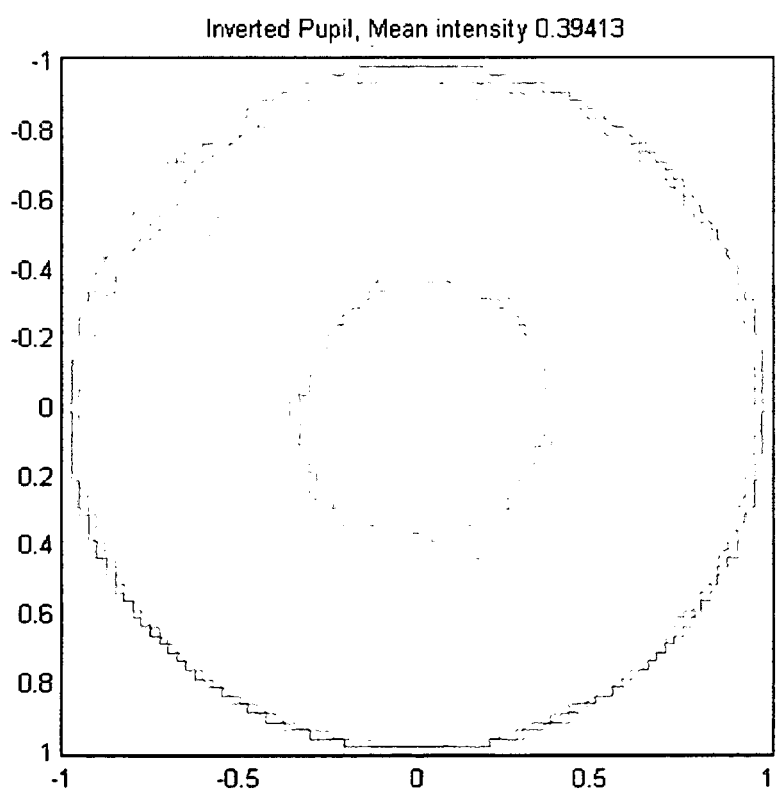
FIG. 5 is an illustration of an inverted pupil illumination function, where the light color circles correspond to the inner and outer sigma for the annular illumination provided by an exposure tool supplier.
Figure 6:
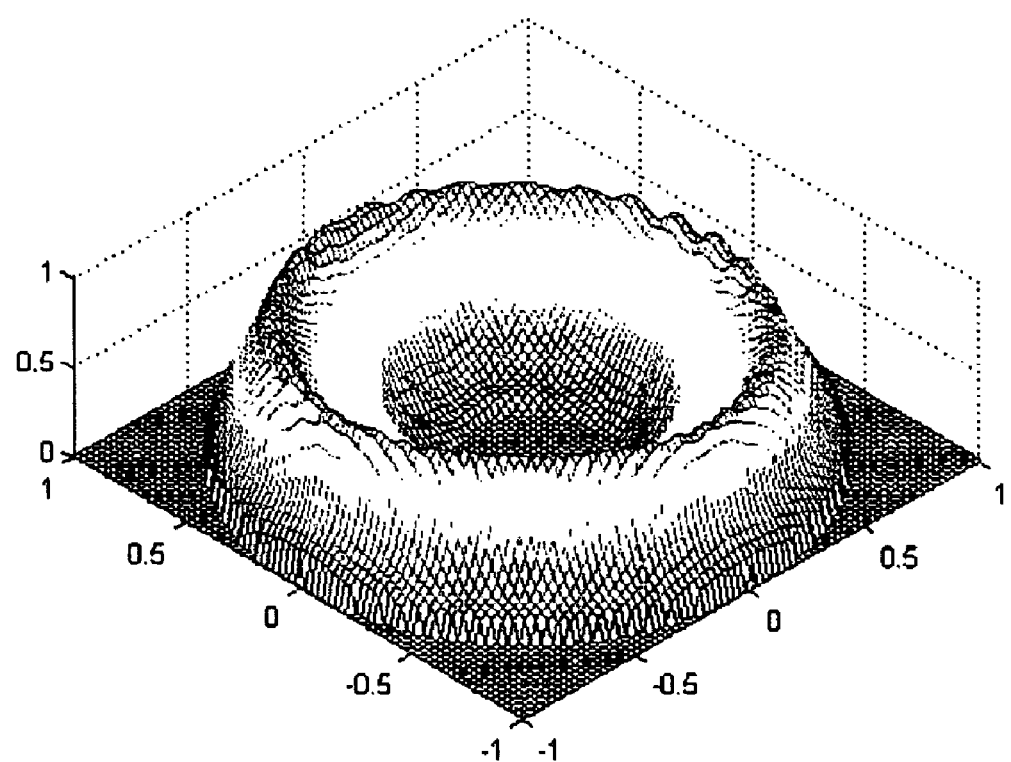
FIG. 6 is a graph of an inverted illumination pupil; (beam intensity profile)

Although the profiling system 6 has been described for measuring and verifying beam intensity profiles (illumination pupil), it should be understood that in addition to using inverted pupil illumination during computational model calibration for optical proximity correction (OPC), the information contained in inverted pupil illumination (see for example FIGS. 5–6), such as distribution, uniformity, average intensity, asymmetry, etc., may also be utilized for monitoring lithography exposure equipment (i.e. stepper).

Figure 9:
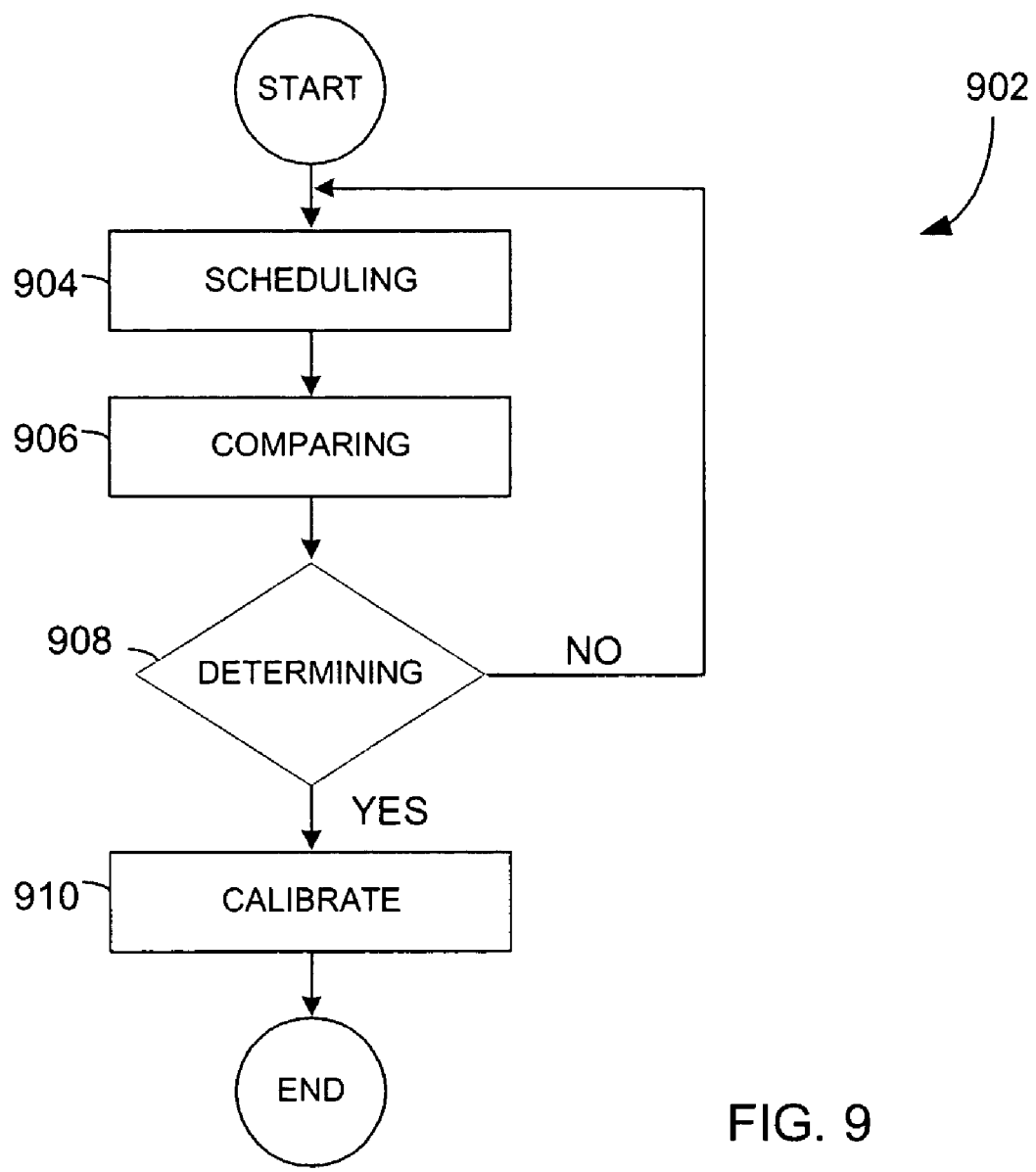
FIG. 9 is a simplified flow chart of the method of monitoring an exposure tool, which method is in accordance with a preferred embodiment of the present invention.

Considering now a method 902 of monitoring lithography exposure equipment in greater detail with reference to FIG. 9, the method 902 begins with a scheduling step 904 which prompts a user of the profiling system 6, such as a process engineer, to run a normally scheduled (weekly, monthly, etc.) test wafers routine using the profiling method 1037 as described herein.

Next, at a comparing step 906, the process engineer compares scheduled results to observe daily, weekly, and monthly changes of distribution, uniformity, average intensity, asymmetry, and so forth. This provides an idea of how to stabilize the tool and or how much the critical dimension will be changed.

Next, at a decision step 908, the process engineer makes a determination from the monitoring information for deciding whether or not a new computational model for OPC should be calibrated using new pupil illumination information.

If a determination is made at step 908 that the critical dimensions have not changed or have not changed to any significant degree, the process returns to step 904 and continues as described previously. On the other hand, if a determination is made that a new computation model for OPC should be calibrated using new pupil illumination information, the process goes to a calibrate step 910 to initiate such action. After calibration, the process 902 ends.

Figure 7:
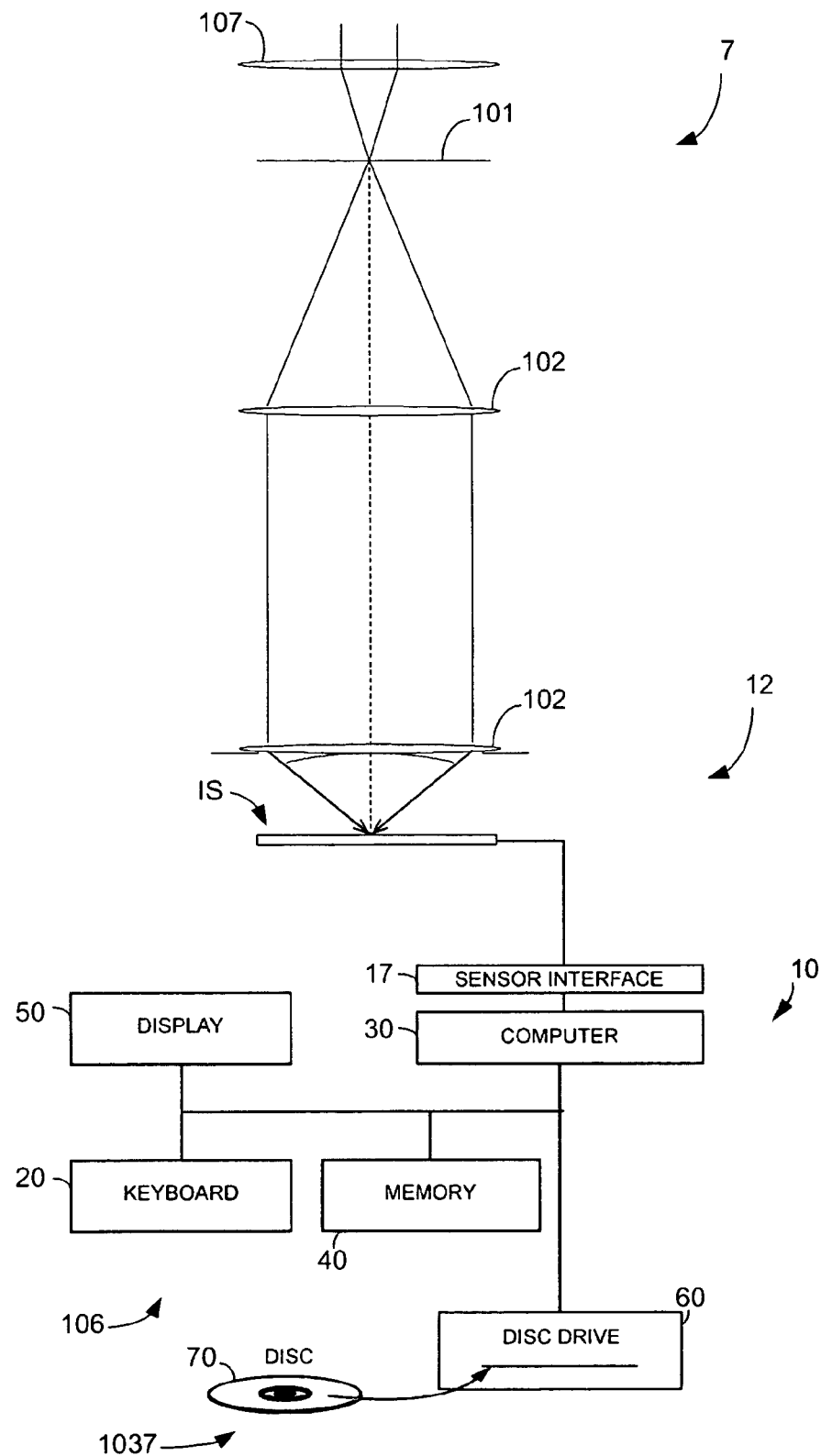
FIG. 7 is a block diagram of another profiling system, which is constructed in accordance with a preferred embodiment of the present invention.

Referring now to the drawings and more particularly to FIG. 7, there is illustrated another profiling system 106, which is constructed according to another preferred embodiment of the present invention. The profiling system 106 is identical to the profiling system 6 except that the projection optical system 7 and the CAD system 10 are coupled together by sensor interface 17 and an image sensor array for aerial image measurements (for example, Brion Technologies, Inc. manufactures such an image sensor array under the tradename of Aerion™). As the operation and construction of such electronic items are well known to those skilled in the art, details of their operation and structure will not be provided. It should be noted however, with the image sensor profiling system 106, instead of printing patterns on a wafer, the image sensor array is utilized to sense the image formed by the test mask. In this manner, the image sensor IS measures the aerial image intensity profile directly. This will result directly in edge contours located at dose to clear divided by dose.

Considering now the computer program product 70, in greater detail with reference to FIG. 8, the computer program product 70 is a computer usable medium that has encoded thereon computer readable codes. The computer readable codes enable a user, via the CAD system 10, to cause the profiling system 6 to measure and verify the beam intensity profile (illumination pupil) for the lithography exposure equipment, which forms part of the projection optical system 7.

More particularly, the computer readable program code encoded on the disc 70 causes the profiling system 6 to characterize an illumination pupil of an exposure tool, by processing a plurality of pinhole test patterns formed at a plurality of test site locations and then, locating the contour edges of pinhole test patterns to facilitate extracting illumination pupil characteristics. In short, the program code allows a conventional test mask, such as the test mask 101, to be exposed with different dose and defocus settings to form a focus exposure matrix of a plurality of pinhole test patterns indicative of an inverted illumination pupil and then to use the inverted illumination pupil during computational model calibration for optical proximity correction OPC.

The computer readable code causes the system 6 to utilize the test mask to provide a plurality of point sources within an illumination pupil plane grid using a default numerical aperture of the exposure tool. In this manner a numerical database is established that is indicative of said point sources at a plurality of different defocus values.

The computer readable code then causes the system 6 to activate the projection system 7 to expose the test mask and print a plurality of pinhole test patterns at a plurality of different site locations on a test wafer substrate S. The code also causes the image pickup device 8 to scan the wafer substrate S in order to obtain an image of each point source within said illumination pupil plane grid. This scanned image information is transferred to the CAD system 10, which under control of the code, processes each image of each point source within the illumination pupil plane grid.

The computer readable code then causes the CAD system 10 to sample the numerical database at each point where an edge contour is located in order to solve in a least square sense the illumination pupil intensity value for at least one illumination pupil plane grid point.

As already described, the profiling system 6 provides several unique and novel methods of facilitating computational model verification, including computational model monitoring. The invention therefore, in its broader aspects, is not limited to the specific details and representative embodiments shown and described herein. Accordingly, various modifications may be made without departing from the spirit and scope of the general inventive concept as defined by the appended claims and their equivalents.

We claim:

1. A method for characterizing an illumination pupil of an exposure tool, comprising:
    processing a plurality of pinhole test patterns formed at a plurality of test site locations to facilitate locating edges; and
    extracting illumination pupil characteristics in response to locating contour edges during said step of processing;
    wherein said step of processing includes:
    printing individual test patterns at said plurality of test site locations;
    wherein said step of printing includes:
    changing dose and defocus conditions at each individual one of said plurality of test site locations to obtain a focus exposure matrix;
    wherein said step of extracting includes:
    sampling edge contour points; and
    aligning the sampled edge contour points with respect to each other;
    obtaining a weighted summation of aerial image values at each sampled edge contour point over an illumination pupil plane; and
    using a predefined formula to extract the illumination pupil characteristics; and
    wherein said predefined formula is:

$$\frac{D_0}{D_{ij}} \stackrel{LSQ}{=} \sum_{x,y} \Delta k_x \Delta k_y I(k_x, k_y) |U(x_{ijk}, y_{ijk}, z_{ij}; k_x, k_y)|^2$$

$I(k_x, k_y) \geq 0$ where $D_0$ is a dose to clear, $D_{ij}$ is a dose value for corresponding $x_{ijk}$ and $y_{ijk}$ sampled edge contour points, $z_{ij}$ is a defocus value for corresponding $x_{ijk}$ and $y_{ijk}$ sampled edge contour points, $k_x$ and $k_y$ are illumination pupil plane coordinates, and I is a value of the illumination pupil intensity at the points $k_x$ and $k_y$.

2. The method according to claim 1, wherein said pinhole test patterns are formed on a photoresist surface.

3. The method according to claim 1, wherein said pinhole test patterns are formed in a semiconductor wafer.

4. The method according to claim 1, wherein said pinhole test patterns are etched and printed on a test surface.

5. The method according to claim 1, wherein said pinhole test patterns are formed on a sensor array that measures aerial image intensity.

6. A method of characterizing an illumination pupil of an exposure tool, comprising:
    providing a plurality of point sources within an illumination pupil plane grid;
    using a default numerical aperture of the exposure tool to establish a numerical database indicative of said point sources at a plurality of different defocus values;
    obtaining an image of each point source within said illumination pupil plane grid;
    printing a plurality of pinhole test patterns at a plurality of different site locations on a test wafer;
    processing said plurality of pinhole test patterns formed at a plurality of test site locations to facilitate locating edges;
    sampling said numerical database at each point where an edge contour is located; and
    solving in a least square sense for an illumination pupil intensity value for at least one illumination pupil plane grid point; and
    wherein said plurality of different defocus values range between about 3.5 micrometers and about 7.5 micrometers.

7. The method of characterizing according to claim 6, wherein said step of providing includes providing a point source at each grid location within said illumination pupil plane.

8. The method of characterizing according to claim 7 wherein said numerical database is further indicative of aerial images of said point sources at each grid location within said illumination pupil plane at a plurality of different defocus values.

9. The method of characterizing according to claim 6, wherein said step of printing includes using a different predetermined dose and defocus condition at each individual one of said plurality of site locations on said test wafer.

10. The method of characterizing according to claim 6 wherein said step of sampling includes obtaining a weighted summation of aerial image values at each site location corresponding to a single dose and defocus setting over all the site locations within said illumination pupil plane.

11. The method of characterizing according to claim 10, wherein each weighted summation of aerial image values at each site location is given by:

$$\frac{D_0}{D_{ij}} \stackrel{LSQ}{=} \sum_{x,y} \Delta k_x \Delta k_y I(k_x, k_y) |U(x_{ijk}, y_{ijk}, z_{ij}; k_x, k_y)|^2$$

$I(k_x, k_y) \geq 0$ where $D_0$ is a dose to clear, $D_{ij}$ is a dose value for corresponding $x_{ijk}$ and $y_{ijk}$ sampled edge contour points, $z_{ij}$ is a defocus value for corresponding $x_{ijk}$ and $y_{ijk}$ sampled edge contour points, $k_x$ and $k_y$ are illumination pupil plane coordinates, and I is a value of the illumination pupil intensity at the points $k_x$ and $k_y$.

12. The method of characterizing according to claim 6, wherein said step of processing includes:
    applying a de-noising algorithm to each image of a pinhole test pattern to facilitate locating image edge location.

13. The method according to claim 12, wherein said de-noising algorithm is a combination of one or more different de-noising algorithms selected from the group consisting of: a minimum total variance algorithm; a non-linear scalar diffusion algorithm; a Gaussian derivative algorithm; and a non-local means algorithm.

14. A method of characterizing an illumination pupil of an exposure tool, comprising:
providing a plurality of point sources within an illumination pupil plane grid;
using a default numerical aperture of the exposure tool to establish a numerical database indicative of said point sources at a plurality of different defocus values;
obtaining an image of each point source within said illumination pupil plane grid;
printing a plurality of pinhole test patterns at a plurality of different site locations on a test wafer;
processing said plurality of pinhole test patterns formed at a plurality of test site locations to facilitate locating edges;
sampling said numerical database at each point where an edge contour is located; and
solving in a least square sense for an illumination pupil intensity value for at least one illumination pupil plane grid point;
wherein said step of processing includes applying an edge-detection algorithm to facilitate pinhole test pattern edge detection; and
wherein said edge-detection algorithm includes thresholding a gradient of a de-noised point source image.

15. The method according to claim 14, wherein said edge detection algorithm includes thresholding a maximum eigenvalues of a Hessian matrix of a de-noised image of a pinhole test pattern printed using a focus exposure matrix.

16. The method according to claim 14, wherein said edge detection algorithm includes thresholding a minimum eigenvalues of a Hessian matrix of a de-noised image of a pinhole test pattern printed using a focus exposure matrix.

17. A method for characterizing an illumination pupil of an exposure tool, comprising:
processing a plurality of pinhole test patterns formed at a plurality of test site locations to facilitate locating edges;
extracting illumination pupil characteristics in response to locating contour edges during said step of processing;
wherein said step of processing includes:
printing individual test patterns at said plurality of test site locations;
wherein said step of printing includes:
changing dose and defocus conditions at each individual one of said plurality of test site locations to obtain a focus exposure matrix; and
wherein said step of changing includes changing the defocus setting over a range between about 0.1 microns and about 20.0 microns.

18. The method according to claim 17, further comprising the steps of:
monitoring said exposure tool:
wherein said step of monitoring said exposure tool include the steps of:
scheduling an exposure tool verification process on a periodic basis, wherein said verification process includes the steps of:
processing a plurality of pinhole test patterns formed at a plurality of test site locations to facilitate locating edges; and
extracting illumination pupil characteristics in response to locating contour edges during said step of processing; and comparing said extracted illumination pupil characteristics obtained during said period basis to determine the stability of said exposure tool.

19. The method according to claim 18, further comprising:
calibrating another computational model using new pupil illumination information whenever the extracted illumination pupil characteristics obtained during said step of comparing is significantly different form the illumination pupil characteristic obtained during said step of extracting.

20. The method according to claim 19, wherein said method is embodied in a computer program product;
said computer program product including:
a computer usable medium having computer readable program code embodied in said medium for characterizing an illumination pupil of said exposure tool, said computer program product having:
computer readable program code for causing a computer to process a plurality of pinhole test patterns formed at a plurality of test site locations disposed on a test surface; and
computer readable program code for causing the computer to extract illumination pupil characteristics in response to locating contour edges of said plurality of pinhole test patterns.

21. The method according to claim 17 wherein said step of extracting includes:
sampling edge contour points; and
aligning the sampled edge contour points with respect to each other;
obtaining a weighted summation of aerial image values at each sampled edge contour point over an illumination pupil plane; and
using a predefined formula to extract the illumination pupil characteristics.

22. The method according to claim 17, wherein each individual one of said plurality of test site locations is disposed on a test wafer.

23. An apparatus for characterizing an illumination pupil of an exposure tool, comprising:
means for processing a plurality of pinhole test patterns formed at a plurality of test site locations to facilitate locating edges;
means for extracting illumination pupil characteristics in response to locating contour edges during said step of processing;
wherein said means for processing includes:
means for printing individual test patterns at said plurality of test site locations;
wherein said means for printing includes:
means for changing dose and defocus conditions at each individual one of said plurality of test site locations to obtain a focus exposure matrix; and
wherein said means for changing includes means for changing a defocus setting over a range between about 0.1 microns and about 20.0 microns.

24. An apparatus according to claim 23, further comprising:
means responsive to said extracting means for calibrating a computational model for optical proximity correction.

25. An apparatus according to claim 24, wherein said means for processing includes means for changing dose and defocus conditions at each individual one of said plurality of test site locations to obtain a focus exposure matrix.

26. An apparatus according to claim 24, wherein said means for processing includes means for printing said plurality of pinhole test patterns on a test surface.

27. An apparatus according to claim 24, wherein said means for processing includes means for printing and etching said plurality of pinhole test patterns on a test surface.

28. An apparatus according to claim 24, wherein said plurality of pinhole test patterns are formed on a sensor array that measures aerial image intensity.

* * * * *